(12) United States Patent
Kim

(10) Patent No.: US 9,024,339 B2
(45) Date of Patent: May 5, 2015

(54) LIGHT EMITTING DIODE

(75) Inventor: Kyoung Hoon Kim, Goyang-Si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 1650 days.

(21) Appl. No.: 11/993,955

(22) PCT Filed: Jun. 23, 2006

(86) PCT No.: PCT/KR2006/002437
§ 371 (c)(1),
(2), (4) Date: Dec. 26, 2007

(87) PCT Pub. No.: WO2006/137715
PCT Pub. Date: Dec. 28, 2006

(65) Prior Publication Data
US 2008/0197373 A1 Aug. 21, 2008

(30) Foreign Application Priority Data
Jun. 24, 2005 (KR) .................. 10-2005-0055035

(51) Int. Cl.
*H01L 33/00* (2010.01)
*H01L 33/08* (2010.01)
(Continued)

(52) U.S. Cl.
CPC .............. *H01L 33/08* (2013.01); *H01L 33/32* (2013.01); *H01L 33/502* (2013.01)

(58) Field of Classification Search
USPC ........... 257/100, 102, 103, E33.06, E33.061, 257/E33.002, 79, 98, 99; 438/27, 29
See application file for complete search history.

(56) References Cited

U.S. PATENT DOCUMENTS 5,952,681 A * 9/1999 Chen .......................... 257/89
6,642,652 B2 * 11/2003 Collins et al. .............. 313/512
(Continued)

FOREIGN PATENT DOCUMENTS

JP 2000-031531 1/2000
JP 2001339102 12/2001
(Continued)

OTHER PUBLICATIONS

English-Language machine translation of JP 2002-208730. Retrieved from JPO webpage on Oct. 2, 2011.*
(Continued)

*Primary Examiner* — Yu-Hsi D Sun
*Assistant Examiner* — Lauren R Bell
(74) *Attorney, Agent, or Firm* — H.C. Park & Associates, PLC

(57) ABSTRACT

The present invention provides a light emitting diode which comprises a substrate, a light emitting layer including an N-type semiconductor layer and a P-type semiconductor layer formed on the substrate, and a wavelength conversion layer formed on the light emitting layer or on the back of the substrate. The wavelength conversion layer is formed of a Group III nitride semiconductor doped with rare earth elements. The rare earth elements include at least one of Tm, Er and Eu. According to a light emitting diode of the present invention, a desired color can be implemented in various ways by converting the wavelength of primary light emitted from a light emitting chip. Thus, the reliability and quality of products can be improved due to the uniform emission of light with a desired color. Further, since the existing semiconductor process can be utilized in the present invention, its fabrication process can be simplified, process cost and time can be reduced, and the compact products can be obtained.

5 Claims, 5 Drawing Sheets

(51) Int. Cl.
  *H01L 33/32* (2010.01)
  *H01L 33/50* (2010.01)

(56) References Cited

U.S. PATENT DOCUMENTS 6,774,401 B2    8/2004  Nakada et al.
7,358,659 B2 *  4/2008  Cho .............................. 313/498

FOREIGN PATENT DOCUMENTS

| JP | 2002-208730 | | 7/2002 |
| JP | 2002-261325 | | 9/2002 |
| JP | 2002261325 A | * | 9/2002 |
| JP | 2002-368265 | | 12/2002 |
| JP | 2005-268775 | | 9/2005 |
| KR | 1020040021028 | | 3/2004 |
| KR | 102004011698 | | 12/2004 |
| KR | 1020050093058 | | 9/2005 |

OTHER PUBLICATIONS

Machine translation of JP 2002-261325 (translated Nov. 18, 2013).*

* cited by examiner

LIGHT EMITTING DIODE

CROSS-REFERENCE TO RELATED APPLICATION

This application is a U.S. national phase application of PCT International Application No. PCT/KR2006/002437, filed Jun. 23, 2006, which claims priority of Korean Patent Application No. 10-2005-0055035, filed Jun. 24, 2005 the contents of which are incorporated herein by reference in their entirety.

BACKGROUND OF THE INVENTION

1. Field of the Invention

The present invention relates to a light emitting diode, and more particularly, to a light emitting diode capable of uniformly emitting light of a desired color by converting wavelength of an intrinsic emission color of a light emitting diode chip.

2. Description of the Related Art

In general, a light emitting diode refers to a device that produces minority carriers (electrons or holes) injected by means of a p-n junction structure of a compound semiconductor and emits predetermined light due to recombination of the minority carriers. Since the light emitting diode has low power consumption and superior durability, the light emitting diode is applied to a variety of product fields. Further, light of a desired color can be emitted using a single chip or multiple chips.

For instance, in case of the single chip, red light can be emitted using a light emitting chip using GaAsP and the like, green light can be emitted using a light emitting chip using GaP and the like and blue light can be emitted using a light emitting chip using an InGaN/AlGaN double hetero structure.

In case of the multiple chips, white color can also be emitted by simultaneously using light emitting chips that emit red, green and blue lights. However, since the outputs of respective light emitting chips are changed depending on the ambient temperature when case that a specific color is implemented using a plurality of light emitting chips, the color coordinate can be changed. Further, different performance characteristics such as current and voltage requirements of the respective light emitting chips should be considered.

On the other hand, in case of the single chip, light of a desired color can be emitted using a light emitting chip of a compound semiconductor and a phosphor for converting the wavelength of primary light emitted from the light emitting chip.

For example, the blue light from the blue light emitting chip and the yellowish green or yellow light from the phosphor may be mixed by coating a blue light emitting chip with phosphor that emits yellowish green or yellow light using a portion of the blue light from the chip as an excitation source, so that a white color may be obtained. Further, an ultraviolet emitting chip is coated with a phosphor that absorbs the ultraviolet rays from the chip and emits visible light (from green to red), so that the ultraviolet rays can be converted into the visible light.

In general, the wavelength conversion of primary light from the light emitting diode can be obtained by injecting phosphors into epoxy used to fill a reflector cup. That is, liquid epoxy mixed with phosphor powder can be filled in a reflector or receptor mounted with a light emitting chip and then cured after a predetermined period of time. In addition, a light emitting diode can also be formed through a process of injecting the liquid epoxy mixed with phosphor powder into an injector and then potting a given amount of the liquid epoxy on a light emitting diode chip using a dispenser.

However, in a case where phosphor powder is mixed with epoxy, larger phosphor particles are settled down faster than smaller phosphor particles while the mixture is cured since the sizes of phosphor particles are not generally uniform. Thus, the concentration difference in liquid epoxy resin is generated due to the settlement of phosphors, and light emitted from the light emitting diode chip is not uniform. Therefore, there is a problem in color reproducibility and it is difficult to obtain uniform light of a desired color.

Furthermore, in order to prevent liquid epoxy resin from flowing to the sides, an additional receptor, reflector or protrusion is formed. Alternatively, liquid epoxy mixed with phosphor powder may be potted on a light emitting chip using a dispenser. However, since an additional manufacturing process is required, the process time and cost for the product manufacture is increased. Further, since an amount of the phosphor is not uniform when manufacturing the product, unstable colors are produced due the yield problem.

Recently, the light emitting diode products are not limited to display and backlight applications of a liquid crystal display and the like but are employed in the backlight applications of the liquid crystal display for use in electronic goods such as lightweight, thin, short and compact portable wireless telecommunication devices, automobiles and the like. Thus, the miniaturization is gradually needed. However, there is a problem in that the reduction in size of the conventionally manufactured light emitting diode products can be limited to a certain extent.

SUMMARY OF THE INVENTION

Accordingly, the present invention is conceived to solve the aforementioned problems in the art. An object of the present invention is to provide a light emitting diode capable of uniformly and stably implementing desired colors by converting the wavelength of primary light emitted from a light emitting chip.

Another object of the present invention is to provide a light emitting diode using a wavelength conversion process, wherein a manufacturing process can be easily performed due to the use of existing manufacturing processes, manpower and processing costs can be reduced accordingly, and thin light emitting diodes can be manufactured such that they can be employed suitably to display and backlight applications of a liquid crystal display for use in lightweight, thin, short and small electronic devices.

According to an aspect of the present invention for achieving the objects, there is provided a light emitting diode, comprising a substrate, a light emitting layer including an N-type semiconductor layer and a P-type semiconductor layer formed on the substrate, and a wavelength conversion layer formed on the light emitting layer, wherein the wavelength conversion layer is formed of a Group III nitride semiconductor doped with rare earth elements.

According to another aspect of the present invention, there is provided a light emitting diode, comprising a substrate, a light emitting layer including an N-type semiconductor layer and a P-type semiconductor layer formed on the substrate, and a wavelength conversion layer formed on the back of the substrate, wherein the wavelength conversion layer is formed of a Group III nitride semiconductor doped with rare earth elements. Preferably, the substrate is a transparent or translucent substrate and a reflection electrode is further formed on the light emitting layer.

The rare earth elements may include at least one of Tm, Er and Eu.

Preferably, the wavelength conversion layer is composed of at least one layer for emitting light with a wavelength shorter than that of light emitted from the light emitting layer. More preferably, when there are two or more wavelength conversion layers, a wavelength conversion layer from which light with a shorter wavelength is emitted is first formed.

The light emitting layer further includes an active layer between the N-type semiconductor layer and the P-type semiconductor layer.

The wavelength conversion layer may be formed to extend up to sides of the P-type semiconductor layer, the N-type semiconductor layer and the substrate. Further, the wavelength conversion layer may be grown using any one of Metal Organic Chemical Vapor Deposition (MOCVD), Chemical Vapor Deposition, Plasma Chemical Vapor Deposition (PCVD), Molecular Beam Epitaxy (MBE), or Hydride Vapor Phase Epitaxy (HVPE).

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE INVENTION

Figure 1:
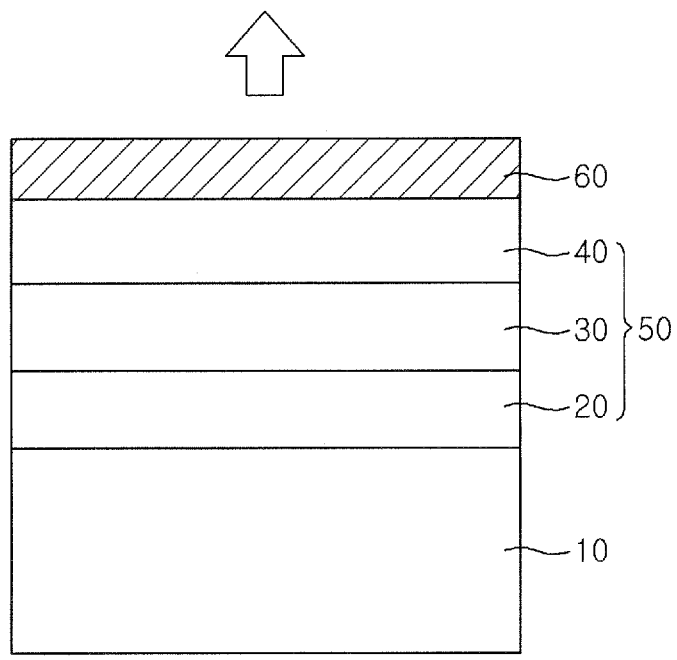
FIG. 1 is a sectional view illustrating a first embodiment according to the present invention.

Hereinafter, preferred embodiments of the present invention will be described in detail with reference to the accompanying drawings. However, the present invention is not limited to the embodiments set forth herein but can be implemented in different forms. Rather, the preferred embodiments are merely provided to allow the present invention to be completely described herein and to fully convey the scope of the invention to those skilled in the art. In the drawings, like elements are designated by the same reference numerals.

In a light emitting diode of the present invention, a nitride semiconductor obtained by doping rare earth elements on a conventional nitride semiconductor light emitting diode structure is grown such that it can be used as a wavelength conversion layer.

The rare earth elements are elements having atom numbers of 58 to 71 in a sixth period of the periodic table, and elements in which a 4f inner shell is filled in a state where the valence shell has been filled. The 4f shell in which electrons are not fully filled in the rare earth elements enables the transitions between many energy levels, so that the rare earth elements can have various emission ranges.

Rare earth elements doped on Group III nitride semiconductors having a wide band gap determine emission colors by determining an energy level participating in a light emitting process, and the emission colors are deteiniined by an energy difference between the ground state and the excited state of doping ions in the nitride semiconductors. For example, a GaN semiconductor doped with Tm elements forms an emission spectrum in a 477 nm range and exhibits a blue emission phenomenon by means of electronic transition. A GaN semiconductor doped with Er elements forms an emission spectrum in a 537 to 558 nm range and exhibits a green emission phenomenon by means of electronic transition. A GaN semiconductor doped with Eu elements forms an emission spectrum having major peaks in a 621 nm range and exhibits a red emission phenomenon by means of electronic transition. Furthermore, a turquoise emission phenomenon can be obtained by uniformly doping Er and Tm elements on a GaN semiconductor, and a yellow emission phenomenon can be obtained by uniformly doping Er and Eu elements on a GaN semiconductor.

FIG. 1 is a sectional view illustrating a first preferred embodiment according to the present invention.

A light emitting diode according to the present invention comprises a substrate 10, a light emitting layer 50 formed on the substrate 10, and a wavelength conversion layer 60 formed on the light emitting layer 50. The light emitting layer 50 includes an N-type semiconductor layer 20, an active layer 30 and a P-type semiconductor layer 40. The light emitting diode may further include a buffer layer between the substrate 10 and the light emitting layer 50 for reducing lattice mismatch between the substrate 10 and subsequent layers upon growth of crystals.

The substrate 10 refers to a general wafer for fabricating a light emitting diode and is formed at least any one of $Al_2O_3$, SiC, ZnO, Si, GaAs, GaP, $LiAl_2O_3$, BN, AlN and GaN. In this embodiment, a crystal growth substrate formed of sapphire is used.

The N-type semiconductor layer 20 is a layer in which electrons are produced and may be formed of an N-type compound semiconductor layer and an N-type cladding layer. Preferably, the N-type compound semiconductor layer is made of GaN doped with N-type impurities, but the present invention is not limited thereto. That is, a variety of material layers with semiconductor properties can be used as the N-type compound semiconductor layer. The P-type semiconductor layer 40 is a layer in which holes are produced and may be formed of a P-type clad layer and a P-type compound semiconductor layer. Preferably, the P-type compound semiconductor layer is made of AlGaN doped with P-type impurities, but the present invention is not limited thereto. That is, a variety of material layers with semiconductor properties can be used as the P-type compound semiconductor layer.

The active layer 30 is a region in which a predetermined band gap and quantum wells are formed such that electrons and holes are recombined with each other. The active layer 30 may contain InGaN. Furthermore, the wavelength of light emission generated due to the combination of the electrons and holes varies according to the kind of a material constituting the active layer 30. Therefore, it is preferred that a semiconductor material contained in the active layer 30 be controlled depending on a target wavelength.

The wavelength conversion layer 60 for converting the wavelength of primary light emitted from the light emitting layer 50 is formed on the light emitting layer 50. In this embodiment, a nitride semiconductor doped with rare earth elements is used as the wavelength conversion layer 60. Preferably, the wavelength conversion layer 60 is made of a GaN compound semiconductor. Generally, rare earth element dopants include Tm for blue emission, Eu for red emission and Er for green emission.

In the light emitting diode of the present invention, the wavelength conversion layer 60 has an advantage in that it can be formed through ordinary deposition and growth processes used to grow the aforementioned plurality of material layers. That is, the aforementioned material layers are formed through a variety of deposition and growth processes including MOCVD (Metal Organic Chemical Vapor Deposition), CVD (Chemical Vapor Deposition), PCVD (Plasma-enhanced Chemical Vapor Deposition), MBE (Molecular Beam Epitaxy), HVPE (Hydride Vapor Phase Epitaxy) and the like.

Therefore, since the wavelength conversion layer 60 can be formed using the existing process without an additional process, a process can be simplified and the process time and cost can also be reduced. That is, a process of forming an additional receptor, reflector or protrusion needed to prevent a resin from flowing to the sides is omitted to reduce manpower and to skip a cumbersome operation for potting the mixture of fluorescent pigments with liquid epoxy resins on respective light emitting diode chips.

The light emitting layer 50 emits primary light when the aforementioned light emitting diode according to the present invention is connected with electricity and then driven. The primary light impinges on the wavelength conversion layer 60 which in turn converts a portion or all of the primary light impinging on the wavelength conversion layer 60 into light with a certain wavelength longer than that of the primary light. The materials and structures of the light emitting layer 50 and the types of the wavelength conversion layer 60 are not restricted but can be formed in various ways depending on the desired emission colors and structures. To apply the wavelength conversion process, however, the emission wavelength of the primary light emitted from the light emitting layer 50 of the light emitting diode is preferably shorter than that of light emitted from the wavelength conversion layer 60.

For example, a wavelength conversion layer 60 is formed on a green light emitting layer 50 by using a GaN compound semiconductor doped with Eu elements. The light emitting layer 50 generates primary green light which in turn impinges on the wavelength conversion layer 60. The wavelength conversion layer 60 converts a portion or all of the primary light impinging on the wavelength conversion layer 60 into red light having a certain wavelength longer than that of the primary light. At this time, a degree of wavelength conversion can be controlled by adjusting the doping concentration and distribution or the thickness of the wavelength conversion layer 60. That is, the red emission can be obtained by converting the primary light into red light, and yellow emission can be finally obtained by combining the red light converted by the wavelength conversion layer 60 with green light transmitted through the wavelength conversion layer 60. A fraction of the primary light, which is transmitted through the wavelength conversion layer 60 and not converted into the red light, can be predicted and controlled by more accurately measuring and adjusting the amount and distribution of dopants on the wavelength conversion layer 60 and the thickness of the wavelength conversion layer 60.

Furthermore, since the wavelength conversion layer 60 obtained by uniformly doping and distributing rare earth elements on a GaN semiconductor is formed on the light emitting layer 50, the uniform wavelength conversion of the primary light can be made. Thus, the color stability and uniformity can be expected.

A white light emitting diode currently used in various ways can be manufactured using the foregoing wavelength conversion process. For example, a wavelength conversion layer 60 is formed on a blue light emitting layer 50 by using a GaN compound semiconductor on which Eu and Er elements are uniformly doped. The light emitting layer 50 generates primary blue light which in turn is impinges on the wavelength conversion layer 60 such that a portion of the impinging blue light is converted into yellow light. A blue light corresponding to a portion of the primary light from the light emitting layer 50 is mixed with yellow light converted by the wavelength conversion layer 60 such that white color can be implemented.

Figure 2:
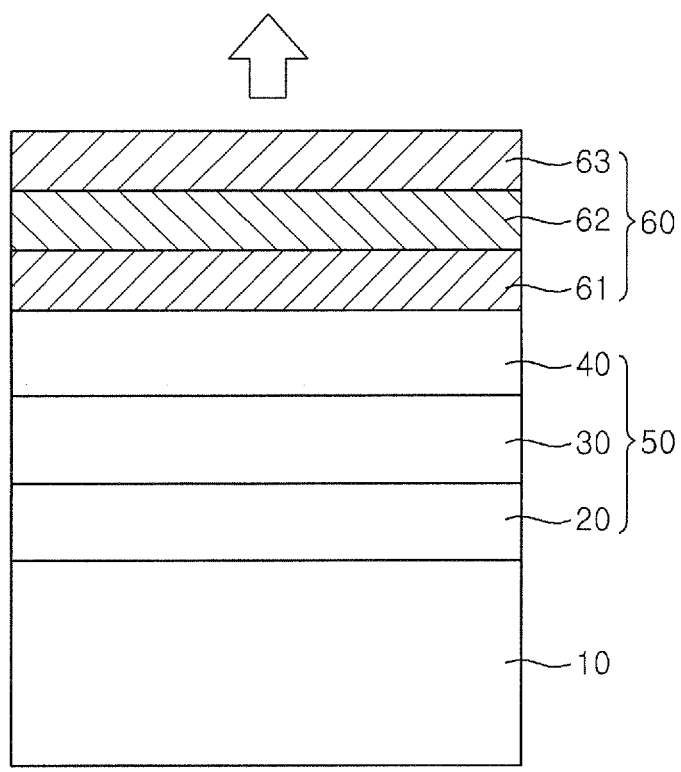
FIG. 2 is a sectional view illustrating a second embodiment according to the present invention.

The wavelength conversion layer 60 is not limited to a single layer as described above, but it may be formed in a plurality of layers, if desired, as described in a second embodiment of the present invention illustrated in FIG. 2.

FIG. 2 is a sectional view illustrating a second embodiment according to the present invention.

A light emitting diode according to the present invention comprises a substrate 10, a light emitting layer 50 formed on the substrate 10, and a plurality of wavelength conversion layers 60 formed on the light emitting layer 50. The light emitting layer 50 includes an N-type semiconductor layer 20, an active layer 30 and a P-type semiconductor layer 40. The light emitting diode may further include a buffer layer between the substrate 10 and the light emitting layer 50 for reducing lattice mismatch between the substrate 10 and subsequent layers upon growth of crystals. A light emitting diode according to the second embodiment is almost the same as the light emitting diode according to the first embodiment except that the plurality of wavelength conversion layers 60 are formed on the light emitting layer 50. As described above, the light emitting layer 50 and the wavelength conversion layers 60 are formed on the substrate 10 through a variety of deposition and growth processes including MOCVD, CVD, PCVD, MBE, HVPE and the like.

The materials and structures of the light emitting layer 50 and the types of the wavelength conversion layer 60 are not restricted but can be formed in various ways depending on the desired emission colors and structures. To apply the wavelength conversion process, however, the emission wavelength of the primary light emitted from the light emitting layer 50 of the light emitting diode is preferably shorter than that of light emitted from the wavelength conversion layer 60.

In this embodiment, a nitride semiconductor doped with rare earth elements is used as the wavelength conversion layer 60. Preferably, the wavelength conversion layer 60 is made of a GaN compound semiconductor. Generally, rare earth element dopants include Tm for blue emission, Eu for red emission and Er for green emission. Since a plurality of the wavelength conversion layers 60 are sequentially formed on the light emitting layer 50, the primary light emitted from the light emitting layer 50 can be effectively converted such that the light emission of a desired color can be obtained. Preferably, a wavelength conversion layer with shorter light emission wavelength is first formed among the plurality of the wavelength conversion layers 60. That is, the present invention is characterized in that the wavelength conversion layers 60 have longer light emission wavelengths as they go from a lower side to an upper side.

For example, three wavelength conversion layers 61, 62 and 63 for generating blue, green and red light are formed on an ultraviolet emitting layer 50 by using GaN compound semiconductors doped with Tm, Er and Eu elements, respectively. That is, a first wavelength conversion layer 61 for generating blue light, a second wavelength conversion layer 62 for generating green light and a third wavelength conversion layer 63 for generating red light are sequentially formed on the light emitting layer 50. When the light emitting diode is connected with electricity and then driven, the primary light impinges on the first wavelength conversion layer 61 which in turn absorbs and converts a portion or all of the primary light into blue light with a certain wavelength longer than that of ultraviolet rays. At this time, the converted blue light impinges on the second wavelength conversion layer 62 for converting a portion of the blue light into green light. A portion of the blue light is converted into the green light, whereas the other portion is not converted and transmitted through the second wavelength conversion layer 62. Further, the second wavelength conversion layer 62 is capable of converting a portion or all of the remaining primary light into green light. The third wavelength conversion layer 63 can be formed to convert the blue or green light into red light. Therefore, a predetermined fraction of the blue light emitted by the first wavelength conversion layer 61 or a predetermined fraction of the green light emitted by the second wavelength conversion layer 62 are converted into the red light by means of the third wavelength conversion layer 63. Furthermore, the remaining primary light is converted into the red light by means of the third wavelength conversion layer 63. Portions of the blue and green light that have not been converted are transmitted through the third wavelength conversion layer 63 and then combined with the red light to create white light.

A light emitting diode with a variety of emission colors, particularly, a white light emitting diode can be manufactured using the GaN semiconductors doped with rare earth elements as the wavelength conversion layers 60.

Figure 3:
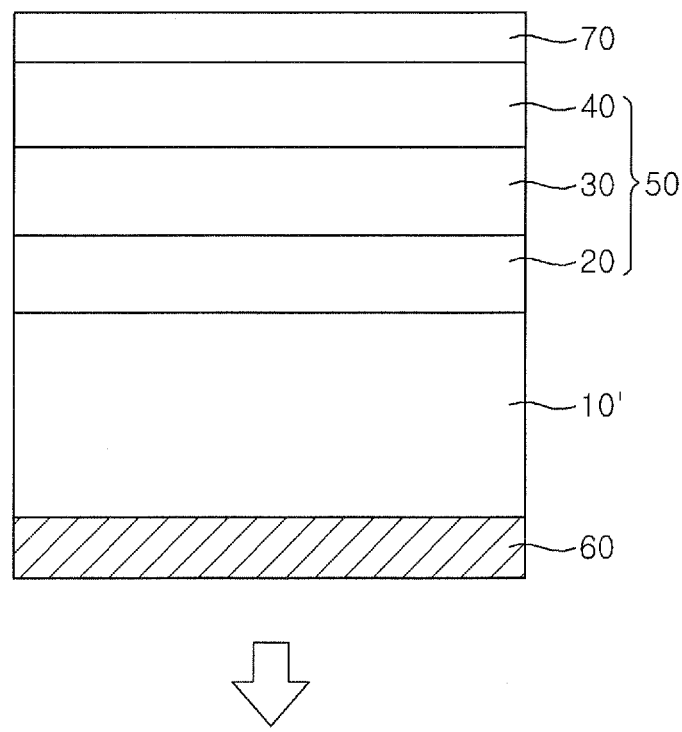
FIG. 3 is a sectional view illustrating a third embodiment according to the present invention.

FIG. 3 is a sectional view illustrating a third embodiment according to the present invention.

A light emitting diode according to the third embodiment of the present invention comprises a transparent or translucent substrate 10', a light emitting layer 50 formed on the substrate 10' and a wavelength conversion layer 60 formed on the back of the substrate 10'. Preferably, a reflection electrode 70 is formed on the surface of the light emitting layer 50. The light emitting layer 50 comprises an N-type semiconductor layer 20, an active layer 30 and a P-type semiconductor layer 40. The light emitting diode may further include a buffer layer between the substrate 10' and the light emitting layer 50 for reducing lattice mismatch between the substrate 10' and subsequent layers upon growth of crystals. These material layers are formed through the aforementioned various deposition and growth processes. In this embodiment, a GaN compound semi-conductor doped with rare earth elements is used as the wavelength conversion layer 60 which in turn can be formed through the same deposition process as in the first and second embodiments of the present invention without deviating from the existing process.

Detailed description of this embodiment will be omitted herein since they are the same as those of the previous embodiments illustrated in FIGS. 1 and 2. The number and structure of the light emitting layer 50 and the wavelength conversion layer 60 according to this embodiment of the present invention are not limited to those of the previous embodiments shown in FIGS. 1 and 2, but they can be formed in various ways, if desired.

The light emitting layer 50 emits primary light when the light emitting diode according to this embodiment of the present invention is connected with electricity and then driven. The primary light passes through the substrate 10' and impinges on the wavelength conversion layer 60 which in turn converts a portion or all of the primary light impinging on the wavelength conversion layer 60 into light with a certain wavelength longer than that of the primary light. The materials and structures of the light emitting layer 50 and the types of the wavelength conversion layer 60 are not restricted but can be formed in various ways depending on the desired emission colors and structures. To apply the wavelength conversion process, however, the emission wavelength of the primary light emitted from the light emitting layer 50 of the light emitting diode is preferably shorter than that of light emitted from the wavelength conversion layer 60.

Furthermore, a degree of wavelength conversion can be controlled by adjusting the concentration and distribution of dopants in the wavelength conversion layer 60 or the thickness of the wavelength conversion layer 60. That is, all of the primary light emitted from the light emitting layer 50 can be converted, and a portion of the converted primary and a portion of the light transmitted through the wavelength conversion layer 60 may be mixed with each other.

A fraction of the primary light which is not converted and transmitted through the wavelength conversion layer 60 can be predicted and controlled by more accurately measuring and adjusting the amount and distribution of dopants in and the thickness of the wavelength conversion layer 60. Accordingly, a light emitting diode capable of improving the reproducibility of desired colors and having high quality and reliability can be obtained.

Furthermore, since the wavelength conversion layer 60 obtained by uniformly doping and distributing rare earth elements on a GaN semiconductor is formed on the light emitting layer 50, the uniform wavelength conversion of the primary light can be made. Thus, the color stability and uniformity can be expected.

Figure 4:
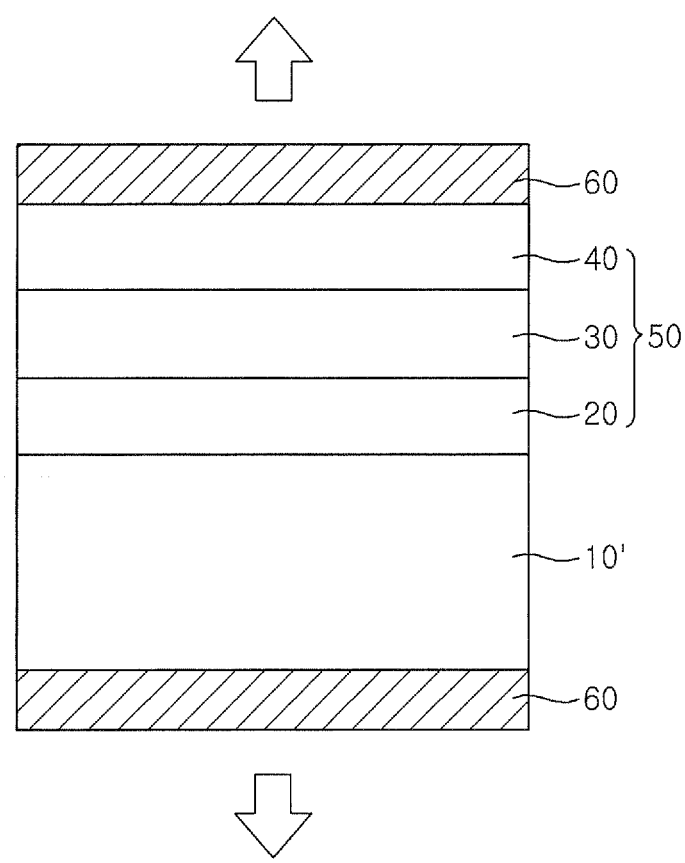
FIG. 4 a sectional view illustrating a fourth embodiment according to the present invention.
Figure 5:
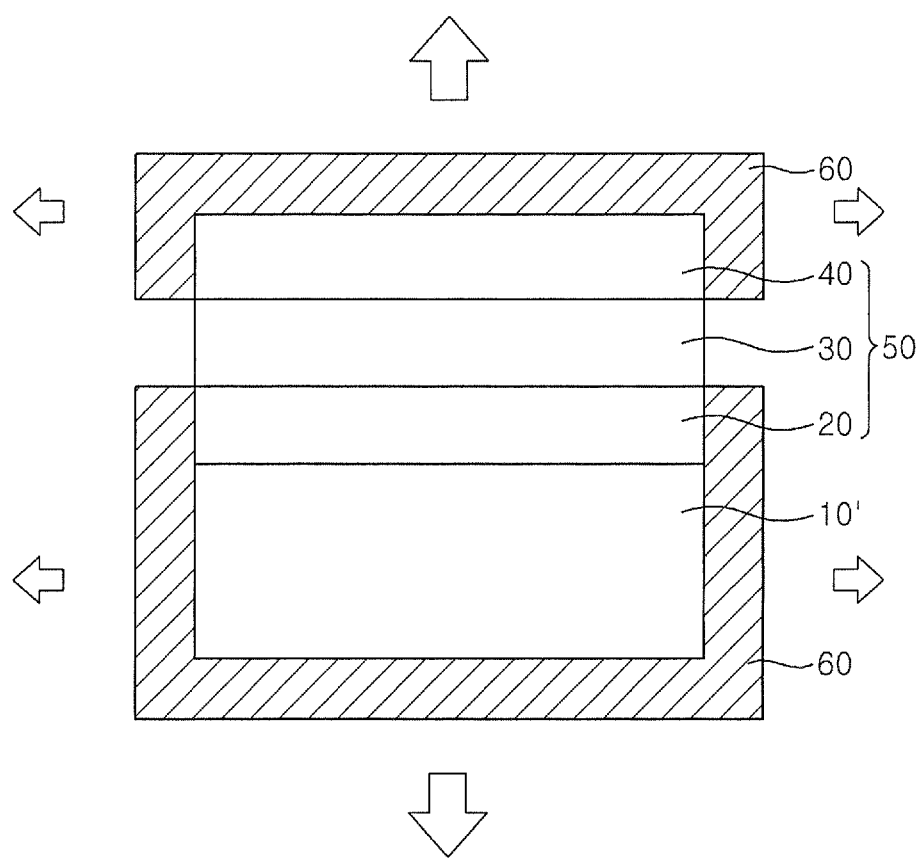
FIG. 5 is a sectional view illustrating a modified example of the fourth embodiment according to the present invention.

In a light emitting diode according to the present invention, the number and structure of the wavelength conversion layers 60 are not limited to the foregoing but they can be formed in various ways as illustrated in FIG. 4 or 5.

FIG. 4 is a sectional view illustrating a fourth embodiment according to the present invention.

A light emitting diode according to the present invention comprises a transparent or translucent substrate 10' a light emitting layer 50 formed on the substrate 10' and wavelength conversion layers 60 formed respectively on the substrate 10' and the light emitting layer 50. The light emitting layer 50 comprises an N-type semiconductor layer 20, an active layer 30 and a P-type semiconductor layer 40. The light emitting diode may further include a buffer layer between the substrate 10' and the light emitting layer 50 for reducing lattice mismatch between the substrate 10' and subsequent layers upon growth of crystals. These material layers are formed through the aforementioned various deposition and growth processes. In this embodiment, a GaN compound semi-conductor doped with rare earth elements is used as the wavelength conversion layer 60 which in turn can be formed through the same deposition process as in the previous embodiments of the present invention without deviating from the existing process.

In this embodiment of the present invention, the wavelength conversion layers 60 are formed on upper and lower surfaces of a light emitting diode from which light is emitted as illustrated in FIG. 4 such that effective wavelength conversion of the primary light emitted from the light emitting layer 50 can be made and the color stability and reproducibility can be improved. The light emitting diode according to the fourth embodiment is formed such that the wavelength conversion layers 60 can be formed to extend up to the sides of the light emitting diode, as illustrated in a modified example of the fourth embodiment illustrated in FIG. 5, in addition to on the upper and lower surfaces of the light emitting diode, in order to further improve the wavelength conversion of the primary light. The modified example of FIG. 5 is not limited to the foregoing, but it may be applied to the other embodiments of the present invention.

A method of manufacturing the aforementioned light emitting diode according to the present invention is merely one embodiment, and the present invention is not limited thereto. That is, a variety of structures and manufacturing methods of the light emitting diode can be used according to the characteristics and the convenience of process of the device. For example, the wavelength conversion layer of the present invention may be formed on a horizontal light emitting diode as well as a vertical light emitting diode in which the light emitting layer and the wavelength conversion layer are sequentially formed on the aforementioned substrate. After sequentially forming an N-type semiconductor layer, an active layer and a P-type semiconductor layer on a substrate, a photolithographic process using a mask is performed to expose a portion of the N-type semiconductor layer. A wavelength conversion layer is formed by causing a GaN semiconductor doped with rare earth elements to be grown on the P-type semiconductor layer and the exposed N-type semiconductor layer, and the wavelength conversion layer can convert the wavelength of the primary light emitted from the light emitting layer to emit light with a desired color. Of course, various structures other than the aforementioned structure of the light emitting diode according to the foregoing embodiments can be applied.

A light emitting diode for emitting light with a desired color can be fabricated by applying a wavelength conversion process without greatly deviating from the conventional process of fabricating the light emitting diode through the general semiconductor process. In particular, a light emitting diode for emitting white light can be easily fabricated by using a wavelength conversion process together in the existing process of fabricating a light emitting diode for emitting light with a certain wavelength. Accordingly, since the light emitting diode so configured is formed thinner than the conventionally fabricated product, a miniaturized light emitting diode can be obtained.

Further, in a light emitting diode according to the present invention, since a wavelength conversion layer can be formed through a more uniform doping process as compared with when phosphors are mixed with a conventional liquid epoxy, more uniform and stable emission of light with a desired color can be obtained and thus the quality and reliability of products can also be improved.

According to a light emitting diode of the present invention, a desired color can be implemented in various ways by converting the wavelength of primary light emitted from a light emitting chip. Thus, the reliability and quality of products can be improved due to the uniform emission of light with a desired color.

Further, in a light emitting diode to which a wavelength conversion process can be applied, since the existing semiconductor process can be utilized in the present invention, its fabrication process can be simplified, process cost and time can be reduced, and the compact products can be obtained.

Although the present invention have been illustrated and described in connection with the preferred embodiments and the accompanying drawings, it is not limited thereto but defined by the appended claims. Accordingly, it will be readily understood by those skilled in the art that various modifications and changes can be made thereto without departing from the spirit and scope of the present invention defined by the appended claims.

What is claimed is:

1. A light emitting diode, comprising:
a substrate comprising an upper surface and an opposing lower surface;
a light emitting layer disposed on the upper surface of the substrate and comprising an N-type semiconductor layer, a P-type semiconductor layer, and an active layer disposed between the N-type and P-type semiconductor layers; and
a wavelength conversion layer comprising a first portion and a second portion, the first portion disposed on upper and lateral surfaces of the light emitting layer, and the second portion disposed on the lower surface of the substrate and the lateral surfaces of the light emitting layer,
wherein:
the wavelength conversion layer is a Group III nitride semiconductor doped with rare earth elements; and
at least a portion of lateral surfaces of the active layer are not covered by the wavelength conversion layer.

2. The light emitting diode as claimed in claim 1, wherein the rare earth elements comprise at least one of Tm, Er and Eu.

3. The light emitting diode as claimed in claim 1, wherein the wavelength conversion layer comprise at least one layer for emitting light with a wavelength longer than that of light emitted from the light emitting layer.

4. The light emitting diode as claimed in claim 1, wherein the wavelength conversion layer comprises two or more wavelength conversion layers, and a first wavelength conversion layer emits the shortest wavelength of light.

5. The light emitting diode as claimed in claim 1, wherein the wavelength conversion layer is grown using any one of Metal Organic Chemical Vapor Deposition (MOCVD), Chemical Vapor Deposition, Plasma Chemical Vapor Deposition (PCVD), Molecular Beam Epitaxy (MBE), or Hydride Vapor Phase Epitaxy (HVPE).

* * * * *